United States Patent
Kobayashi

(10) Patent No.: US 6,526,081 B2
(45) Date of Patent: *Feb. 25, 2003

(54) SURFACE EMITTING SEMICONDUCTOR LASER AND METHOD OF FABRICATING THE SAME

(75) Inventor: Yasuhiro Kobayashi, Osaka (JP)

(73) Assignee: Matsushita Electric Industrial Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/166,903

(22) Filed: Oct. 6, 1998

(65) Prior Publication Data

US 2002/0006144 A1 Jan. 17, 2002

(30) Foreign Application Priority Data

Oct. 7, 1997 (JP) .............................. 9-274044

(51) Int. Cl.$^7$ .............................. H01S 5/183
(52) U.S. Cl. .......................... 372/46; 372/96
(58) Field of Search .................. 372/46, 45, 92, 372/96, 99; 257/97, 98; 438/44, 39

(56) References Cited

U.S. PATENT DOCUMENTS

| | | | | | |
|---|---|---|---|---|---|
| 5,478,774 A | * | 12/1995 | Ackley et al. | ................. | 438/39 |
| 5,493,577 A | * | 2/1996 | Choquette et al. | ............ | 372/46 |
| 5,513,202 A | * | 4/1996 | Kobayashi et al. | ........... | 372/96 |
| 5,568,499 A | * | 10/1996 | Lear | ............................ | 372/45 |
| 5,594,751 A | * | 1/1997 | Scott | ............................ | 372/46 |
| 5,764,674 A | * | 6/1998 | Hibbs-Brenner et al. | ..... | 372/46 |
| 5,892,785 A | * | 4/1999 | Nagai | ........................... | 372/46 |

OTHER PUBLICATIONS

K.D. Choquette et al., "Cavity characteristics of selectively oxidized vertical–cavity lasers", App. Phys. Lett. 66 (25), p. 3413–3415, Jun. 19, 1995.

* cited by examiner

Primary Examiner—Quyen Leung
(74) Attorney, Agent, or Firm—Nixon Peabody LLP; Donald R. Studebaker

(57) ABSTRACT

A lower mirror is formed on an n-type GaAs substrate. Next, an ion implanted region serving as a current confining region is formed through shallow ion implantation. Then, a $SiO_2$ film mask is formed, and a multilayer structure including an active region and an upper mirror is selectively grown on an area not covered with the $SiO_2$ film mask. In this manner, a surface emitting semiconductor laser with a low resistance and a low threshold current is obtained by using ion implantation and selective oxidation through a simplified fabrication process.

5 Claims, 10 Drawing Sheets

SURFACE EMITTING SEMICONDUCTOR LASER AND METHOD OF FABRICATING THE SAME

BACKGROUND OF THE INVENTION

The present invention relates to a surface emitting semiconductor laser and a method of fabricating the same, and more particularly, it relates to a surface emitting semiconductor laser including a current confining region formed by ion implantation or selective oxidation and a method of fabricating this surface emitting semiconductor laser.

Vertical cavity surface emitting lasers are advantageous not only in obtaining a light beam with a circular section but also in two-dimensionally integrating plural emitting portions on a single substrate at a high density. Also, the vertical cavity surface emitting lasers can be operated with small power consumption and fabricated at a low cost. Owing to these advantages, the surface emitting semiconductor lasers have been regarded as a promising light source for the optical communications and optical information processing of the next generation, and have been variously examined and developed. Recently, the surface emitting laser diodes are realized in a variety of structures, including one having a very low threshold current of approximately 10 $\mu$A (microampere) on the laboratory level and one commercially available at approximately 3000 yen.

The surface emitting semiconductor lasers are classified, depending upon their current confinement structures, into the following three types: Lasers including a simple mesa structure; lasers including a current confining layer formed by ion implantation; and lasers including a current confining layer formed by selectively oxidizing a semiconductor layer including Al. The lasers including a simple mesa structure have been utilized since the initial stage of the examination until today. The lasers including a current confining layer formed by ion implantation are widely used in commercially available semiconductor lasers. The lasers including a current confining layer formed by selectively oxidizing a semiconductor layer including Al are still now under research in laboratories. In view of electrical resistance and heat resistance, a laser with a planer structure including a current confining layer formed by ion implantation or selective oxidation, or a laser including a mesa structure with a very large area is advantageous to a laser including a simple mesa structure.

The surface emitting semiconductor lasers with a current confinement structure formed by ion implantation can be fabricated in various types of structures.

FIGS. 9A and 9B are schematic diagrams of conventional surface emitting semiconductor lasers 900 and 910, respectively described as a first conventional technique.

Each of the surface emitting semiconductor lasers 900 and 910 is formed on an n-type GaAs substrate 901, and has a multilayer structure for laser oscillation including an n-type lower mirror 902, an active region 904 and a p-type upper mirror 905. The lower mirror 902 is formed on the substrate 901, and the active region 904 is sandwiched between the lower mirror 902 and the upper mirror 905. The active region 904 comprises an active layer 903 of a strained quantum well including an $In_{0.2}Ga_{0.8}As$ layer working as a well layer and a GaAs layer working as a barrier layer sandwiched between cladding layers of $Al_{0.5}Ga_{0.5}As$, and is designed so as to oscillate light with a wavelength of approximately 980 nm. Furthermore, a p-type electrode 906 is formed on the upper mirror 905. Also, an n-type electrode 907 is formed on the back surface of the n-type substrate 901, so that the light output of the laser can be taken out from the back surface of the substrate 901.

In the surface emitting semiconductor laser 900, an ion implanted region 908 formed by ion implantation is disposed in an area surrounding a given closed area within the upper mirror 905. On the other hand, in the surface emitting semiconductor laser 910, the ion implanted region 908 is formed so as to make the active region 904 be a closed area.

Now, the operation of the conventional surface emitting semiconductor lasers 900 and 910 will be described. Since the ion implanted region 908 is a relatively higher resistance area, a current injected into the active region 904 through the p-type electrode 906 and the n-type electrode 907 is confined by the ion implanted region 908. Accordingly, the current injected into the laser can be efficiently injected into the small closed area, resulting in largely decreasing a threshold current.

An example of the surface emitting semiconductor lasers including a current confining layer formed by selective oxidation is described in Applied Physics Letter, 66 (1995), pp. 3413–3415. FIG. 10 is a sectional view for schematically showing the structure of a second conventional surface emitting semiconductor laser 1000 described in this paper.

In the conventional surface emitting semiconductor laser 1000, an active layer 1020 and a p-type upper mirror 1030 are successively stacked on an n-type lower mirror 1010, and a mesa is formed through etching to expose the lower mirror 1010. Furthermore, a ring-shaped p-type electrode 1040 is formed on the top surface of the upper mirror 1030. The upper mirror 1030 is formed by stacking AlGaAs and GaAs, in which merely the lowermost AlGaAs is formed as an $Al_{0.98}Ga_{0.02}As$ layer 1032 with a composition ratio of Al of 0.98 and the remaining portion is formed as an $Al_{0.9}Ga_{0.1}As/GaAs$ mirror 1033 formed by alternately stacking $Al_{0.9}Ga_{0.1}As$ layers with a composition ratio of Al of 0.9 and GaAs layers. By utilizing a difference (of approximately 15:1) in the oxidation rate between $Al_{0.98}Ga_{0.02}As$ and $Al_{0.9}Ga_{0.1}As$, the $Al_{0.98}Ga_{0.02}As$ layer 1032 alone is selectively oxidized from the side face of the mesa, thereby forming an $Al_xO_y$ region 1031.

Next, the operation principle of the conventional surface emitting semiconductor laser 1000 will be described. Since the $Al_xO_y$ region 1031 serves as an insulator, a current injected into the laser is confined by the $Al_xO_y$ region 1031 so as to flow merely through the $Al_{0.98}Ga_{0.02}As$ layer 1032, that is, a small area. Accordingly, the current can be efficiently confined, resulting in decreasing a threshold current. Moreover, owing to a difference in the refractive index between the $Al_{0.98}Ga_{0.02}As$ layer 1032 and the $Al_xO_y$ region 1031, light is confined in the lateral direction to some extent, which can further decrease the threshold current.

However, when the ion implanted region crosses the active layer in the first conventional technique, the threshold current can be increased because the active layer is damaged by the ion implantation. Also, when the ion implanted region is disposed within the upper mirror, although the ion implantation does not damage the active layer, the following problems can be caused: Since the concentration distribution of the implanted ion in the vertical direction has a spread (namely, the change in the ion concentration is not abrupt), the current confining region is unavoidably formed in a position away from the active layer. Accordingly, the current is spread in the lateral direction while flowing between the current confining region and the active layer, and hence, the current cannot be effectively confined. Also, since the current confining region has a large thickness in the vertical direction, the device resistance is inevitably increased.

On the other hand, in the second conventional laser, the semiconductor layer with a thickness of several tens nm is required to be oxidized from the side face of the mesa in the lateral direction by several tens $\mu$m (micrometer). Since it is very difficult to control the oxidation rate and the shape to be oxidized, it is difficult to form the current confining region in a desired shape. When a necessary and minimum number of layers (one layer in FIG. 10) are to be oxidized so as not to increase the device resistance, it is necessary to form a hybrid mirror including two types of AlGaAs layers having different composition ratios of Al, which makes the fabrication difficult.

The objects of the present invention are providing (1) a surface emitting semiconductor laser in which an active layer is not damaged by formation of a current confining region through ion implantation and a method of fabricating this surface emitting semiconductor laser; and (2) a surface emitting semiconductor laser in which selective oxidation for forming a current confining region is highly accurately controlled and a method of fabricating this surface emitting semiconductor laser.

SUMMARY OF THE INVENTION

The surface emitting semiconductor laser of this invention comprises an active region including an active layer, and a lower mirror and an upper mirror sandwiching the active region, and a current confining region is disposed to surround a closed area below the active layer, and the current confining region is formed of a higher resistance layer obtained by implanting ions.

Alternatively, the surface emitting semiconductor laser of this invention comprises an active region including an active layer, and a lower mirror and an upper mirror sandwiching the active region, and at least one of the lower mirror and the upper mirror is formed of a semiconductor multilayer film obtained by alternately and repeatedly stacking a first layer and a second layer, and merely the first layer closest to the active region includes a closed area made of a semiconductor and an oxide area surrounding the closed area.

Furthermore, the method, of this invention, of fabricating a surface emitting semiconductor laser provided with an active region including an active layer, and a lower mirror and an upper mirror sandwiching the active region, comprises a first crystal growth step of forming a first multilayer structure excluding the active layer and including at least the lower mirror on a semiconductor substrate; an ion implantation step of selectively implanting ions into an outside area of a selected closed area on a top surface of the first multilayer structure, whereby forming a current confining region with a higher electric resistance around the closed area; and a second crystal growth step of forming a second multilayer structure including the active layer on the first multilayer structure after the ion implantation step.

Alternatively, the method of fabricating a surface emitting semiconductor laser provided with an active region including an active layer, and a lower mirror and an upper mirror sandwiching the active region, comprises a first crystal growth step of alternately and repeatedly stacking a first semiconductor layer including Al and a second semiconductor layer matching in lattice size with the first semiconductor layer, whereby forming, on a semiconductor substrate, a first multilayer structure having the second semiconductor layer as an uppermost layer; a step of forming a mask for defining a closed area on a top surface of the uppermost layer of the first multilayer structure; an oxidation step of forming a current confining region with a higher electric resistance by selectively oxidizing the first semiconductor layer below the uppermost layer from an area on a top surface of the uppermost layer of the first multilayer structure where the mask is not formed; and a second crystal growth step of forming a second multilayer structure on the first multilayer structure.

DETAILED DESCRIPTION OF THE INVENTION

Preferred embodiments of the invention will now be described with reference to the accompanying drawings.

EMBODIMENT 1

Figure 1:
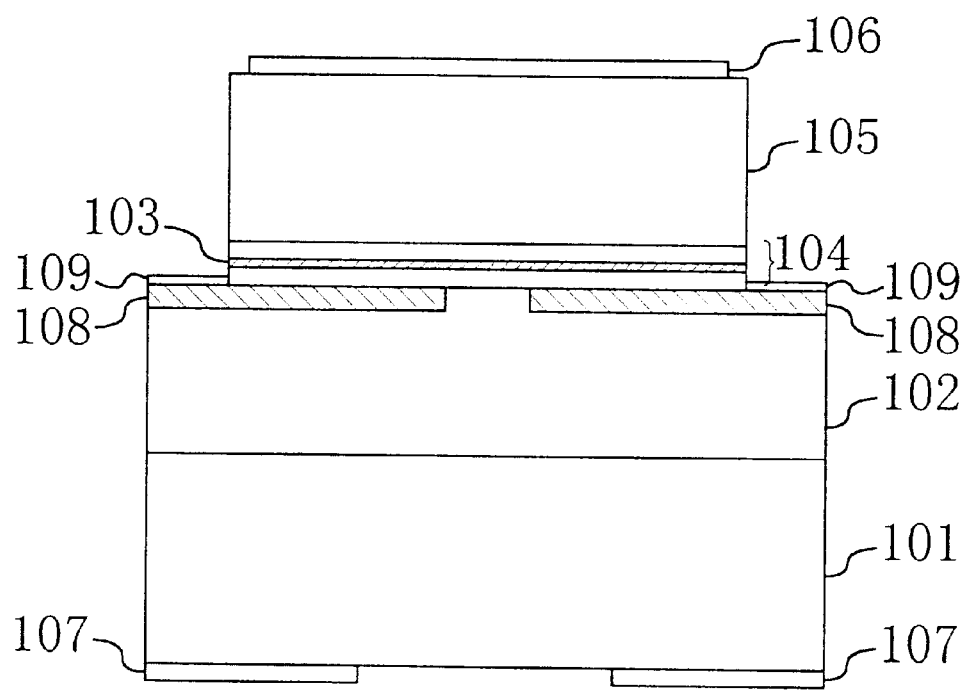
FIG. 1 is a sectional view of a surface emitting semiconductor laser according to a first embodiment of the invention.

FIG. 1 is a schematic sectional view of a surface emitting semiconductor laser 100 according to a first embodiment of the invention.

The surface emitting semiconductor laser 100 is formed on an n-type GaAs substrate 101, and has a multilayer structure for laser oscillation including an n-type lower mirror 102, an active region 104 and a p-type upper mirror 105. The lower mirror 102 is formed on the substrate 101, and the active region 104 is sandwiched between the lower mirror 102 and the upper mirror 105. This multilayer structure will now be described in detail.

The lower mirror 102 is formed by stacking 24.5 pairs of n-type GaAs layers and n-type AlAs layers, and functions as a lower distributed Bragg reflector. Similarly, the upper mirror 105 is formed by stacking 24.5 pairs of p-type GaAs layers and p-type AlAs layers, and functions as an upper distributed Bragg reflector. These mirrors together form a vertical cavity.

The active region 104 comprises an active layer 103 with a strained quantum well including an $In_{0.2}Ga_{0.8}As$ layer functioning as a well layer and a GaAs layer functioning as a barrier layer, and a pair of $Al_{0.5}Ga_{0.5}As$ cladding layers sandwiching the active layer 103. The active region 104 is designed to emit light with a wavelength of approximately 980 nm.

In an uppermost portion of the lower mirror 102, an ion implanted region 108 is formed to a depth of approximately 100 nm from the surface of the lower mirror 102 in an area surrounding a circular closed area with a diameter of approximately 10 $\mu$m. The ion implanted region 108 is formed out of a layer whose resistance is increased by ion implantation, and functions as a current confining region for confining a current to the circular closed area.

In an area with a diameter of approximately 50 $\mu$m surrounding the circular closed area on the top surface of the lower mirror 102, a $SiO_2$ film 109 is formed. The center of this circular area accords with the center of the aforementioned circular closed area with a diameter of approximately 10 $\mu$m. On an area of the top surface of the lower mirror 102 where the $SiO_2$ film 109 is not formed, a laser mesa (mesa multilayer structure) including the active region 104 and the upper mirror 105 is formed.

A p-type electrode 106 is formed on the top surface of the upper mirror 105, and an n-type electrode 107 is formed on the back surface of the n-type substrate 101. The light output of the laser is taken out from the back surface of the substrate 101.

In FIG. 1, merely one vertical cavity is shown, but it goes without saying that plural vertical cavities can be two-dimensionally arranged on the same substrate.

Next, with reference to FIGS. 2A through 2D, a method of fabricating the surface emitting semiconductor laser 100 will be described. In FIGS. 2A through 2D, like reference numerals are used to refer to like elements shown in FIG. 1, and the description is omitted.

Figure 2A:
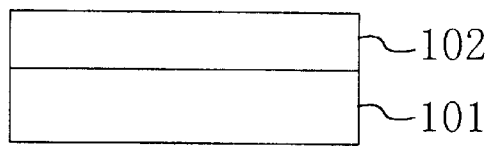
FIGS. 2A through 2D are sectional views for showing fabrication procedures for the surface emitting semiconductor laser of FIG. 1.

First, as is shown in FIG. 2A, plural epitaxial layers are continuously grown on the n-type GaAs substrate 101 by the MBE (molecular beam epitaxy) or the MOCVD (metal organic CVD) (which procedure is designated as first crystal growth), thereby forming the lower mirror 102.

Figure 2B:
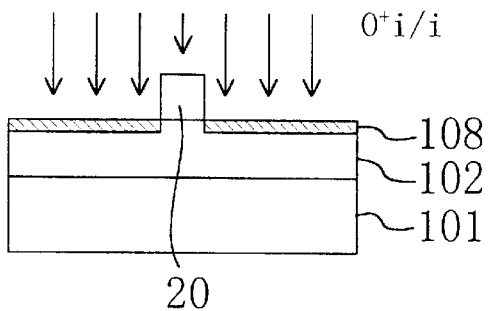

Next, as is shown in FIG. 2B, a resist mask 20 with a thickness of approximately 5 $\mu$m is formed on the lower mirror 102 by the lithography. The position and the shape of this resist mask 20 define the position and the shape of the circular closed area surrounded with the current confining region (See FIG. 1). Oxygen ions ($O^+$) are implanted into the surface of the lower mirror 102 partially covered with the resist mask 20. In this embodiment, the implantation is performed at an acceleration energy of approximately 50 keV and a dose of 1 through $2 \times 10^{14}$ $cm^{-2}$. In this case, the oxygen ions are implanted to a depth of approximately 100 nm from the surface in a part of the surface of the lower mirror 102 not covered with the resist mask 20. In this manner, the ion implanted region 108 with a higher resistance is formed directly below the top surface of the lower mirror 102. The range of a preferred implantation acceleration energy depends upon the mass of the ions to be implanted, and is specifically approximately 20 through 100 keV when the oxygen ions are used. The ions to be implanted can be hydrogen ions.

In this embodiment, the ions are implanted substantially vertically to the substrate surface, but the ions can be implanted at angles against the substrate surface. For example, when the ions are implanted at angles against the substrate surface while rotating the substrate, the ion implanted region can be spread to a portion below the edge of the resist mask 20. As a result, the current can be confined in a fine closed area having a smaller size than the resist mask 20.

In the formation of the ion implanted region 108, a plasma surface treatment apparatus can be used in stead of a conventional ion implantation apparatus. Since the ion implanted region 108 of this invention is formed in the vicinity of an exposed surface, the ion implanted region functioning as the current confining region can be formed by exposing the surface to, for example, oxygen plasma. In this case, by using a $SiO_2$ mask instead of the resist mask 20, the mask can be prevented from being ashed during the oxygen plasma treatment. Also, by applying high frequency power to the substrate by using a high density plasma system so as to cause a self-bias, the ion implanted region 108 can be formed in a larger thickness.

Figure 2C:
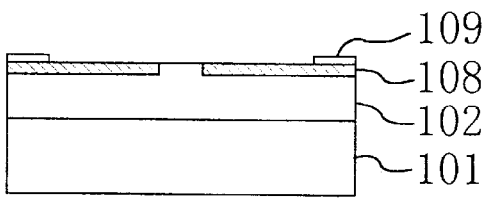

Next, after removing the resist mask 20, a $SiO_2$ film is deposited by using the thin film deposition technique. Then, the $SiO_2$ film is patterned by the lithography and etching, thereby forming the $SiO_2$ mask 109 to be used for selective growth as is shown in FIG. 2C. The $SiO_2$ mask 109 for selective growth is formed in a pattern covering an area on the top surface of the lower mirror 102 excluding the area where the multilayer structure including the active layer and the like is formed. The $SiO_2$ mask 109 preferably has a thickness of 100 nm through 300 nm.

Figure 2D:
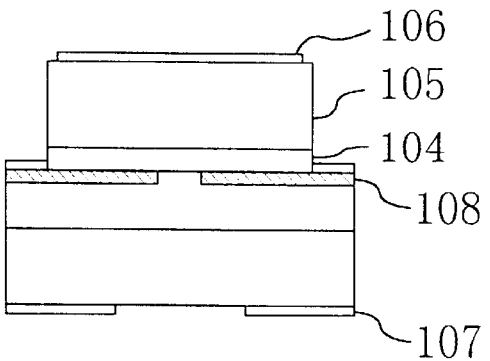

Then, as is shown in FIG. 2D, plural semiconductor layers are selectively epitaxially grown on the area not covered with the $SiO_2$ mask 109 by the MBE or the MOCVD (which procedure is designated as second crystal growth). On the $SiO_2$ mask 109, no semiconductor is epitaxially grown. In this manner, the mesa-shaped multilayer structure including the active region 104 and the upper mirror 105 is formed. The plane shape of the mesa-shaped multilayer structure is controlled in accordance with the pattern of the $SiO_2$ mask 109. In this embodiment, the $SiO_2$ mask 109 is patterned so as to have a circular opening, and hence, the mesa-shaped multilayer structure has a circular plane shape. In the case where plural vertical cavities are two-dimensionally arranged on the same substrate, the $SiO_2$ mask 109 is patterned so as to have plural openings for defining the positions and the shapes of mesas corresponding to the respective cavities. The material for the mask 109 for the selective growth is not limited to $SiO_2$, but can be any material that has selectivity in the epitaxial growth.

Thereafter, the p-type electrode 106 is formed on the top surface of the upper mirror 105, and the n-type electrode 107 is formed on the back surface of the substrate 101.

Although the epitaxial layers grown on the ion implanted region 108 do not always have good crystallinity, the crystallinity does not lead to any disadvantage because the confined current mainly flows in the epitaxial layers grown on the area where the ions are not implanted.

Now, the structural features of the surface emitting semiconductor laser 100 will be described with reference to FIGS. 3A and 3B.

Figure 3A:
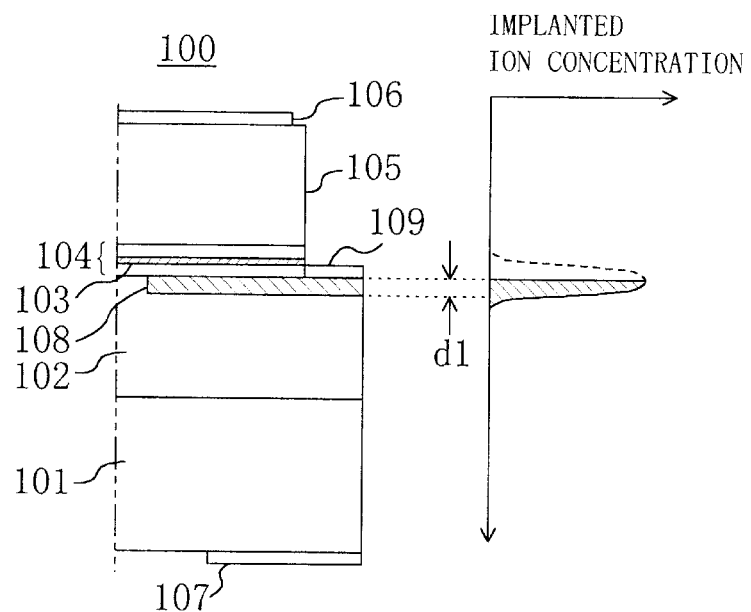
FIG. 3A illustrates ion implantation in the surface emitting semiconductor laser of FIG. 1
Figure 3B:
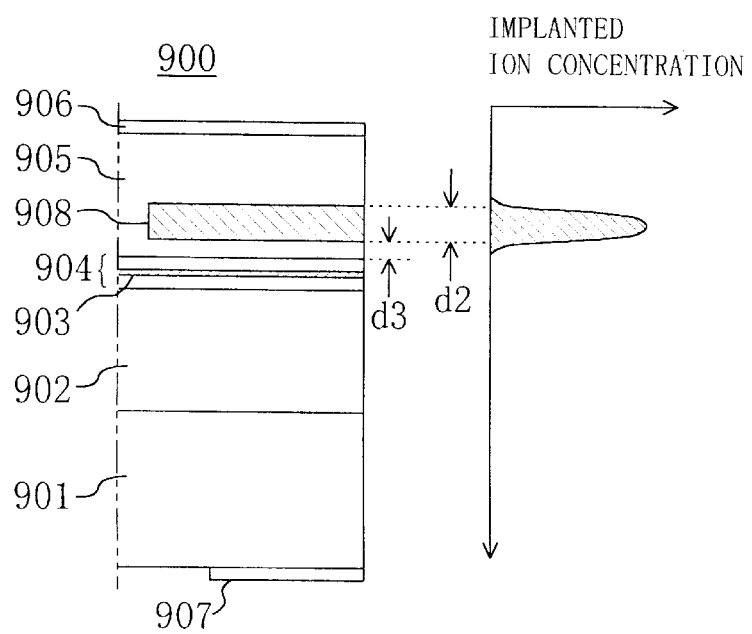
FIG. 3B illustrates ion implantation in a first conventional surface emitting semiconductor laser.
Figure 9A:
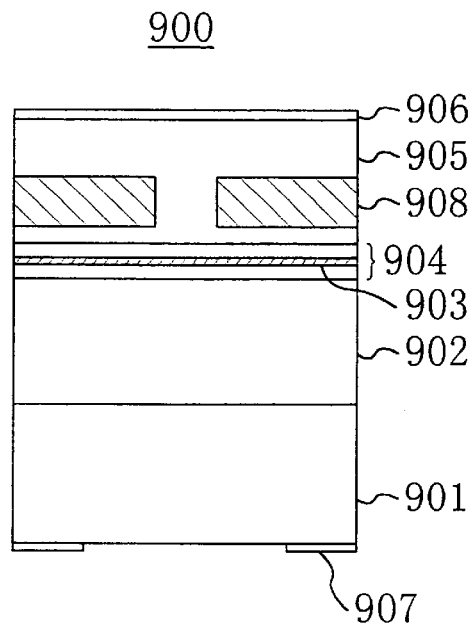
FIGS. 9A and 9B are schematic sectional views of different two types of the first conventional surface emitting semiconductor laser.
Figure 9B:
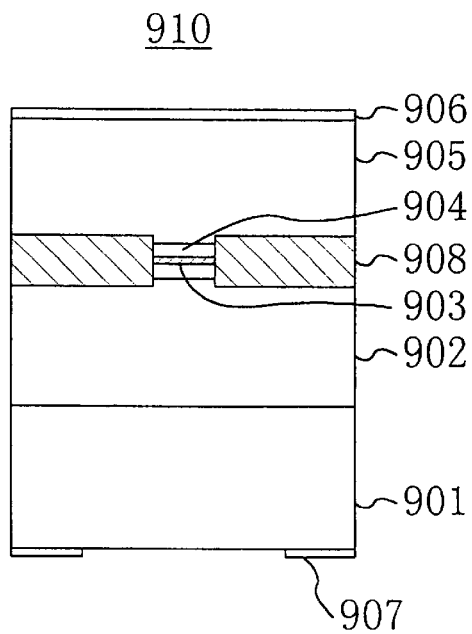

FIG. 3A schematically illustrates a part of the section of the surface emitting semiconductor laser 100 and a distribution of the implanted ions therein, and FIG. 3B schematically illustrates a part of the section of the conventional surface emitting semiconductor laser 900 and a distribution of the implanted ions therein. In FIGS. 3A and 3B, like reference numerals are used to refer to like elements shown in FIGS. 1 and 9, and the description is omitted.

As described above, the ion implanted regions 108 and 908 function as the current confining regions and exhibit the effect to decrease the threshold current. However, the aspect of the current confinement is largely different in the present surface emitting semiconductor laser 100 and the conventional surface emitting semiconductor laser 900.

In general, an area where ions have been implanted has a spread along the depth direction (corresponding to the longitudinal direction in FIGS. 3A and 3B). The distribution of this spread depends upon the dosage and the acceleration energy of the ion implantation, but in the conventional surface emitting semiconductor laser 900, the ion implanted region 908 is formed with a relatively large spread (shown as d2) as is shown in FIG. 3B. In fabricating the conventional surface emitting semiconductor laser 900, the ions are implanted at a comparatively large acceleration energy at which the ions can reach a depth of approximately 2 through 3 μm from the surface, and hence, the implanted ions have such a largely distributed spread along the depth direction. The increase in the thickness of the ion implanted region having a higher resistance leads to increase in the device resistance, resulting in degrading various characteristics such as a threshold current and a light output characteristic.

On the other hand, if the implanted ions reach the active layer 903, the active layer 903 is damaged. Accordingly, the ion implantation is required to be performed so that the ions cannot reach the active layer 903. Therefore, it is necessary to provide a given distance (shown as d3 in FIG. 3B) between the ion implanted region 908 and the active region 904. When the distance (d3) is too large, the current which has been once confined by the ion implanted region 908 can largely expand in the lateral direction before reaching the active layer 903. As a result, the current cannot be sufficiently confined resulting in increasing the threshold current.

In contrast, in the surface emitting semiconductor laser 100 of this embodiment, since the ions are implanted in the uppermost portion of the lower mirror 102 as is shown in FIG. 2B, the ions can be implanted at a necessary and minimum dose and at a comparatively small acceleration energy. Accordingly, the spread (shown as d1) in the concentration distribution along the depth direction can be minimized as is shown in FIG. 3A, resulting in minimizing the increase in the device resistance.

Furthermore, since the active region 104 is formed after the ion implantation, the active layer 103 cannot be damaged by the ion implantation. Also, since there is no distance between the ion implanted region 108 and the active region 104, the current can be efficiently confined, resulting in sufficiently decreasing the threshold current.

Next, the characteristic in the fabricating method of this embodiment will be described.

As is shown in FIGS. 2C and 2D, the selective growth using the SiO₂ mask 109 is carried out in the second crystal growth. The mesa is formed through this selective growth, thereby realizing isolation. According to this method, there is no need to process the semiconductor multilayer structure by using the wet etching and/or the dry etching for forming the mesa. Since it is difficult to control an etch depth, there is a difficulty in forming a mesa in a desired shape with high reproducibility by the etching. However, in the selective growth adopted in the method of this embodiment, a mesa with a desired shape can be obtained with high controllability and reproducibility. Also, in the selective growth, the side surface of the mesa can be free from a damage caused by the etching.

As described above, in the surface emitting semiconductor laser 100, the current confining region is formed through the ion implantation performed after the first crystal growth, and then, the multilayer structure including the active layer is formed through the second crystal growth. As a result, the thickness of the ion implanted region 108 can be minimized, so as to prevent the increase in the device resistance. Furthermore, since there is no need to provide a distance between the ion implanted region 108 and the active region 104 because it is unnecessary to consider the damage on the active layer 103, the current can be very efficiently confined, resulting in sufficiently decreasing the threshold current.

Moreover, the selective growth is adopted for the second crystal growth, and therefore, the mesa can be formed in a self-alignment manner. As a result, there is no need to adopt the etching and the like with poor controllability and reproducibility for isolation, and hence, a desired device can be stably supplied by a simple fabricating method.

In this embodiment, the ions are directly implanted into the lower mirror 102, but instead, the ions can be implanted into another semiconductor layer formed on the lower mirror 102. Significantly, the current confining region is formed by implanting the ions into a semiconductor layer below the active layer before forming the active layer.

In this embodiment, the active region 104 is formed directly on the ion implanted region 108 functioning as the current confining region, but another semiconductor layer can be interposed as an interlayer between the ion implanted region 108 and the active region 104. Needless to say, such an interlayer is not preferred from the view point of current confinement because the lateral spread of the current can be suppressed by decreasing the distance between the ion implanted region 108 and the active layer 104.

The mesa-shaped multilayer structure can be formed by the conventional mesa etching technique instead of adopting the selective growth.

EMBODIMENT 2

Figure 4:
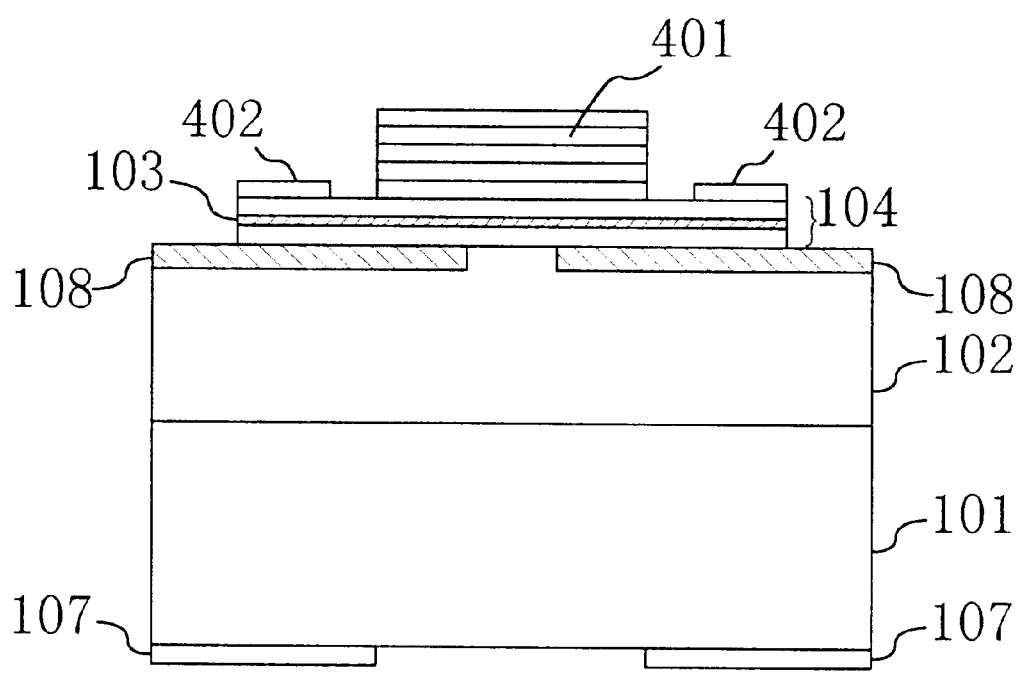
FIG. 4 is a sectional view of a surface emitting semiconductor laser according to a second embodiment of the invention.

FIG. 4 is a schematic sectional view of a surface emitting semiconductor laser 400 according to a second embodiment. In FIG. 4, like reference numerals are used to refer to like elements included in the surface emitting semiconductor laser 100 of the first embodiment, and the description is omitted.

A SiO₂/TiO₂ upper mirror 401 made of a dielectric material is formed on the active region 104 so as to cover the opening of the ion implanted region 108. The upper mirror 401 and the lower mirror 102 together form a vertical cavity. A p-type electrode 402 is formed on a portion of the top surface of the active region 104 where the upper mirror 401 is not formed.

In this embodiment, the upper mirror 401 is made of a dielectric multilayer film in stead of a semiconductor multilayer film as is shown in FIG. 4. In the mirror of the semiconductor multilayer film, since there is a small difference in the refractive index between two kinds of semiconductor layers included therein, the number of pairs of the semiconductor layers included in the mirror is required to be increased in order to attain a desired high reflectance. Therefore, in general, the mirror has a large thickness of approximately 2 through 4 μm. Such a large thickness can burden the crystal growth requiring strict control of a growth rate and a subsequent process. Accordingly, the fabrication procedures can be complicated and the yield can be decreased.

When the mirror of the dielectric multilayer film is thus adopted, a current cannot be directly injected through the mirror, and hence, the current is directly injected by forming the electrode 402 directly on the active region 104. As a result, the current can be injected not through the mirror, which is a main cause of the increase in the device resistance, and hence, the device resistance can be decreased.

As described above, in the surface emitting semiconductor laser 400 of this embodiment, the $SiO_2/TiO_2$ upper mirror 401 is used as the upper mirror and the p-type electrode 402 is formed directly on the active region 104. Therefore, the resultant surface emitting semiconductor laser can attain a low resistance. Furthermore, the dielectric mirror can be realized in a smaller thickness and can be more easily fabricated than the semiconductor mirror. Accordingly, the fabrication procedures for the surface emitting semiconductor laser can be simplified, the yield can be increased, and the fabrication cost can be decreased.

EMBODIMENT 3

Figure 5:
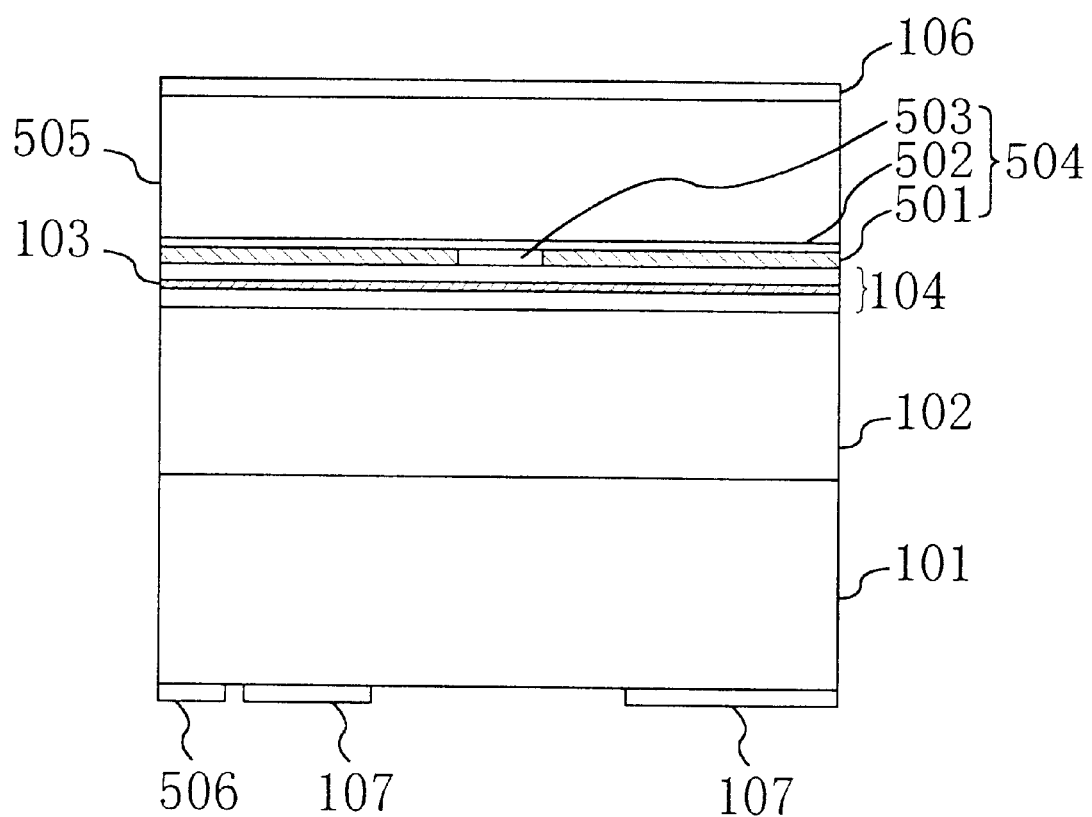
FIG. 5 is a sectional view of a surface emitting semiconductor laser according to a third embodiment of the invention.

FIG. 5 is a schematic sectional view of a surface emitting semiconductor laser 500 according to a third embodiment of the invention. In FIG. 5, like reference numerals are used to refer to like elements included in the surface emitting semiconductor laser 100 of the first embodiment, and the description is omitted.

In this surface emitting semiconductor laser 500, the upper mirror includes a first upper mirror 504 and a second upper mirror 505. The second upper mirror 505 is formed as a distributed Bragg reflector including 24 pairs of p-type GaAs layers and p-type AlAs layers alternately stacked.

The first upper mirror 504 is formed by stacking an AlAs layer 503 (with a thickness of approximately 82.8 nm) and a GaAs layer 502 (with a thickness of approximately 5 nm). In the AlAs layer 503, an outside area surrounding a closed area with a diameter of approximately 10 $\mu$m is oxidized to be an $Al_xO_y$ oxide layer 501 through selective oxidation. Also, on the back surface of the substrate 101, an alignment pattern 506 is formed.

Now, a method of fabricating the surface emitting semiconductor laser 500 will be described with reference to FIGS. 6A through 6D, wherein like reference numerals are used to refer to like elements shown in FIG. 5 so as to omit the description.

Figure 6A:
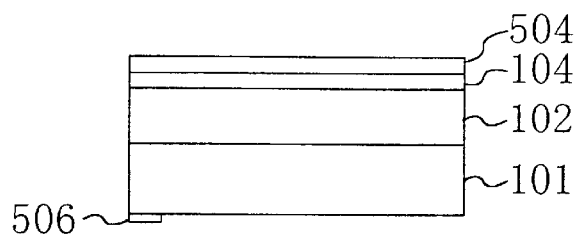
FIGS. 6A through 6D are sectional views for showing fabrication procedures for the surface emitting semiconductor laser of FIG. 5.

First, as is shown in FIG. 6A, the lower mirror 102, the active region 104 and the first upper mirror 504 are successively epitaxially grown on the n-type GaAs substrate 101 by the MBE or the MOCVD. Furthermore, on the back surface of the substrate 101, the alignment pattern 506 used for processing is formed.

Figure 6B:
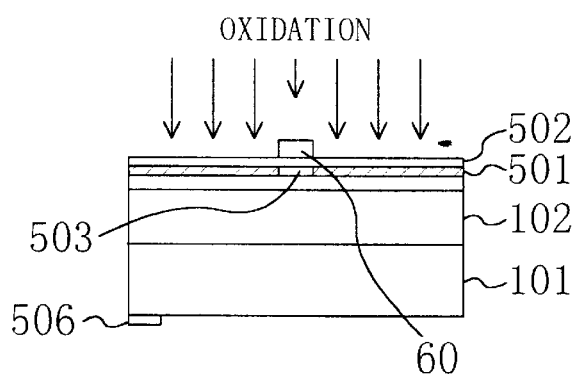

Next, as is shown in FIG. 6B, a $SiO_2$ mask 60 with a thickness of approximately 300 nm is formed on the epitaxially grown layers, and the substrate is then heated at a temperature of approximately 410 through 450° C. in an atmosphere including vapor for 10 through 60 minutes. In this manner, the first upper mirror 504 is partially oxidized, so as to form the AlAs layer 503 included therein. This oxidation is performed not from the side surface but from the top surface of the first upper mirror 504. A portion covered with the $SiO_2$ mask 60 is not oxidized.

When the selective oxidation is thus carried out in the vertical direction from the surface of the AlAs layer 503, an oxide film with a desired shape in accordance with the shape of the mask can be formed. Also, a time required for the oxidation can be shortened as compared with the case where the selective oxidation is performed in the lateral direction from the side surface of the AlAs layer 503. In the selective oxidation performed in the lateral direction from the side surface of the AlAs layer 503, it is difficult to adjust the oxidation distance and the shape of the oxide film. Moreover, when the oxidation rate depends upon the crystal orientation, the area not oxidized is formed in a square shape even when the AlAs layer 503 has a circular shape in a plan view.

Figure 6C:
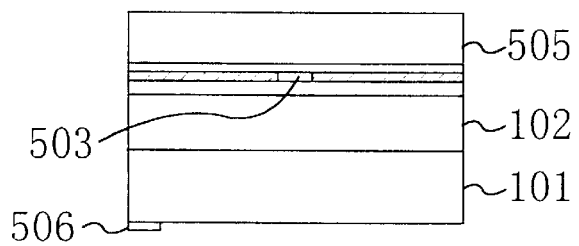

Subsequently, after removing the $SiO_2$ mask 60, the second crystal growth is conducted as is shown in FIG. 6C, thereby forming the second upper mirror 505.

Figure 6D:
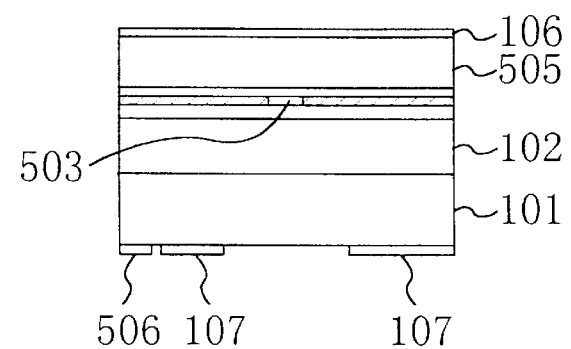

Ultimately, the p-type electrode 106 is formed on the second upper mirror 505 as is shown in FIG. 6D. Furthermore, the n-type electrode 107 is formed on the back surface of the substrate 101 by using the alignment pattern 506 so that a light output can be taken out from a portion directly below the AlAs layer 503.

Now, the operation characteristic of the surface emitting semiconductor laser 500 will be described with reference to FIG. 5.

Since the $Al_xO_y$ oxide layer 501 formed by oxidizing the AlAs layer has an insulating property, an injected current is confined by the $Al_xO_y$ oxide layer 501, so as to flow in the vertical direction through a fine area not oxidized in the AlAs layer 503. Accordingly, the current can be efficiently confined, resulting in decreasing the threshold current. Moreover, since there is a difference in the refractive index between the AlAs layer 503 and the $Al_xO_y$ oxide layer 501, the light can be confined in the lateral direction to some extent, resulting in further decreasing the threshold current.

Furthermore, since the current confining region has a thickness corresponding to one layer of the $Al_xO_y$ oxide layer 501 (namely, approximately 82.8 nm), the current confining region can attain a smaller thickness than those formed out of the ion implanted layers in the first and second embodiments, resulting in further decreasing the device resistance.

Figure 7A:
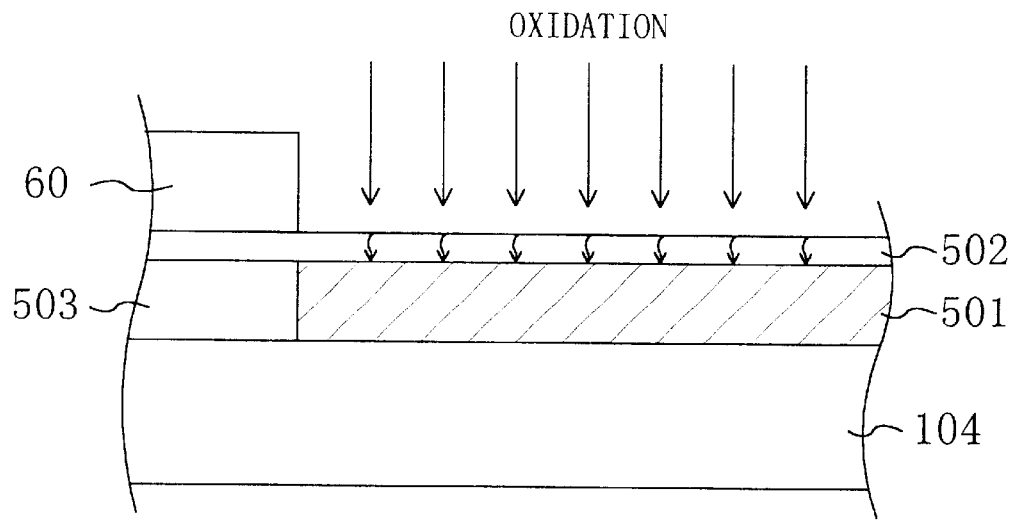
FIG. 7A illustrates selective oxidation in the surface emitting semiconductor laser of FIG. 5
Figure 7B:
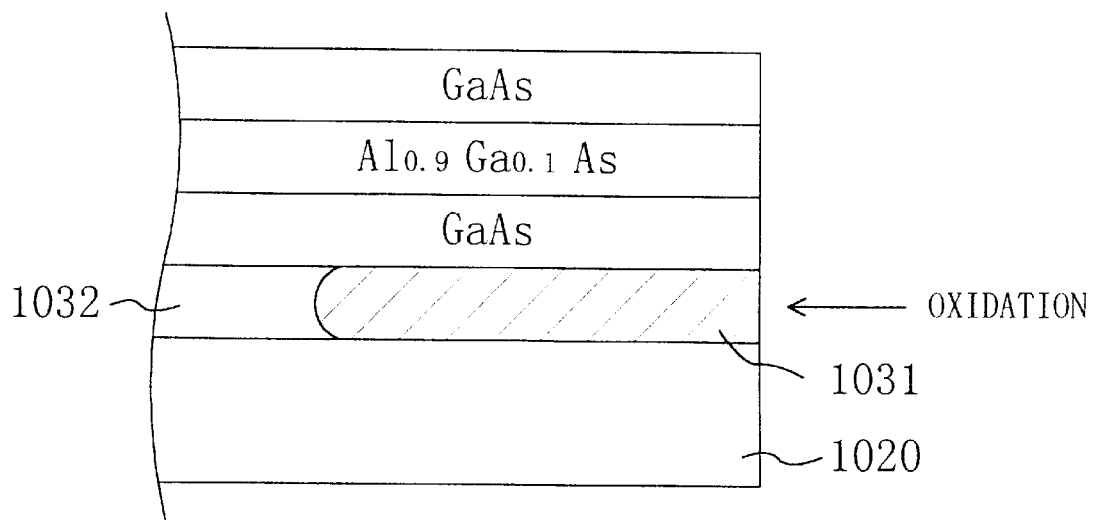
FIG. 7B illustrates selective oxidation in a second conventional surface emitting semiconductor laser.
Figure 10:
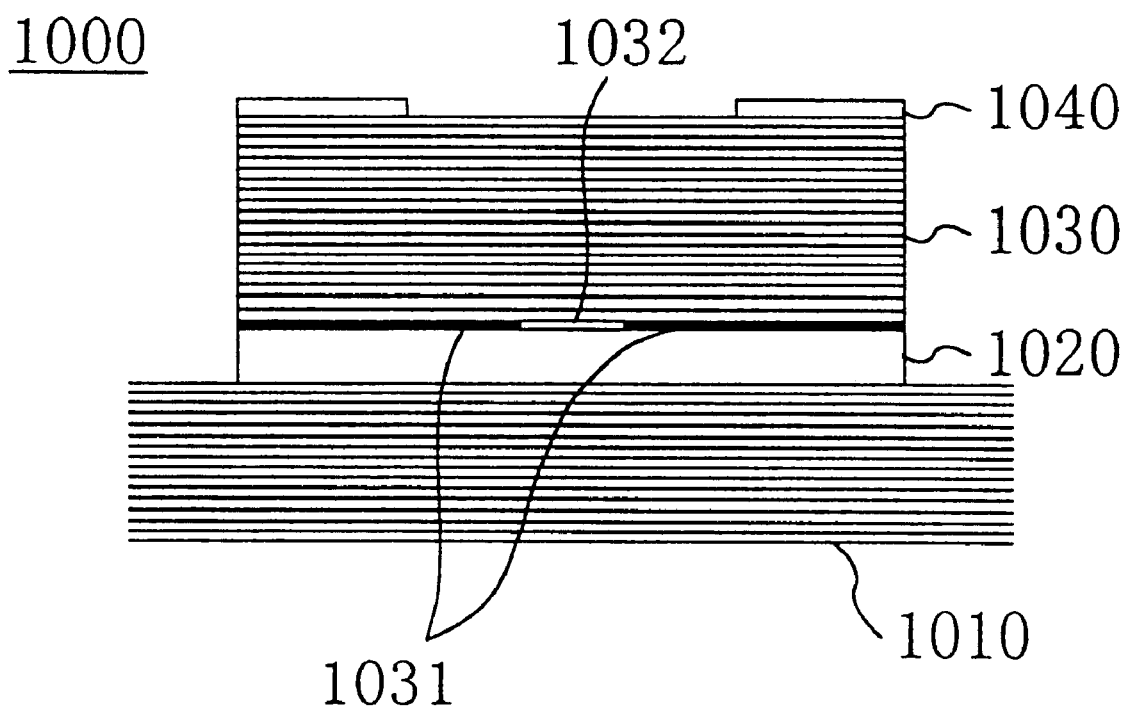
FIG. 10 is a schematic sectional view of the second conventional surface emitting semiconductor laser.

Next, with reference to FIGS. 7A and 7B, the oxidation will be described in detail. FIG. 7A is a partial sectional view of the surface emitting semiconductor laser 500 of this embodiment, and FIG. 7B is a partial sectional view of the conventional surface emitting semiconductor laser 1000. In FIGS. 7A and 7B, like reference numerals are used to refer to like elements shown in FIGS. 5 and 10, and the description is omitted.

In the conventional surface emitting semiconductor laser 1000, the selective oxidation is performed from the side surface of the mesa as is shown in FIG. 7B. In addition, the layer with a thickness of several tens nm should be oxidized by several tens $\mu$m. Since it is very difficult to control the oxidation rate and the shape of the oxidized portion, it is difficult to form the current confining region in a desired shape with high reproducibility.

In contrast, in the surface emitting semiconductor laser 500 of this embodiment, the selectively oxidized region (501) is formed by oxidizing the epitaxially grown layer in the vertical direction from its surface (top surface) as is shown in FIG. 7A. Therefore, the oxide layer 501 can be formed with ease in a desired shape in a short period of time. At this point, it is significant to provide the GaAs layer 502 with a very small thickness of approximately 5 nm on the uppermost surface of the epitaxially grown layers in order to conduct the selective oxidation from the surface of the epitaxially grown layers. If it were not for the GaAs layer 502, the entire AlAs layer could be oxidized as soon as the substrate is taken out from the crystal growth system after the first crystal growth because the AlAs layer is disposed on the uppermost surface of the epitaxially grown layers. As a result, the current confinement structure could not be formed.

In general, a GaAs layer included in a mirror has a thickness of several tens nm. When the GaAs layer with such a thickness is disposed on the uppermost surface of the epitaxially grown layers, the water vapor serving as the oxidizing agent cannot rapidly diffuse through the GaAs layer to reach the AlAs layer, and hence, the AlAs layer cannot be oxidized. Accordingly, the thickness of the GaAs layer 502 is a significant parameter in this embodiment, and since the thickness is approximately 5 nm, the natural oxidation of the AlAs layer 503 can be avoided and the selective oxidation can be effectively performed from the top surface of the epitaxially grown layers. The thickness of the GaAs layer 502 is preferably approximately 1 through approximately 10 nm.

Next, another characteristic of the fabricating method of this embodiment will be described.

In the surface emitting semiconductor laser 500 of this embodiment, the alignment pattern 506 is formed on the back surface of the substrate as is shown in FIG. 6A.

After the second crystal growth, the position of the current confining region (and the closed area surrounded with the current confining region) cannot be specified through observation from either surface of the substrate as is shown in FIG. 6C. Accordingly, in forming the n-type electrode 107 as is shown in FIG. 6D, it is impossible to align the n-type electrode 107 with the current confining region. Therefore, the alignment pattern 506 is previously formed on the back surface of the substrate so that the position of the current confining region can be specified even after the second crystal growth.

As described above, in the surface emitting semiconductor laser 500, the first upper mirror 504 is formed in the first crystal growth so that the very thin GaAs layer 502 can be disposed on the uppermost surface of the epitaxially grown layers, and the selective oxidation is then performed from the top surface of the epitaxially grown layers. As a result, the oxidized region (or the current confining region) can be formed with ease in a desired shape. The conventional selective oxidation is performed from the side surface of the mesa, which is not necessary in this embodiment, and hence, there is no need to form the mesa structure itself.

Also, since the first upper mirror and the second upper mirror can be formed as mirrors with the same structure, there is no need to form a hybrid mirror structure for obtaining an oxide layer in a single layer as in the conventional surface emitting semiconductor laser 1000, resulting in simplifying the crystal growth.

EMBODIMENT 4

Figure 8:
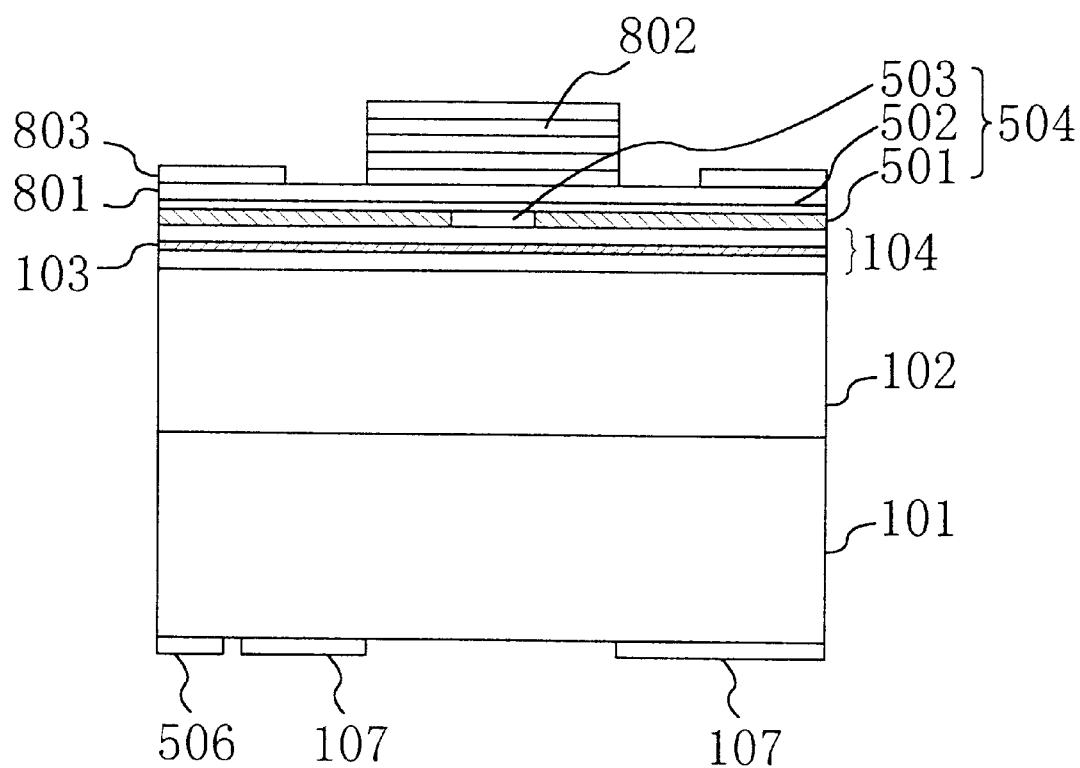
FIG. 8 is a sectional view of a surface emitting semiconductor laser according to a fourth embodiment of the invention.

FIG. 8 is a sectional view of a surface emitting semiconductor laser 800 according to a fourth embodiment of the invention. In FIG. 8, like reference numerals are used to refer to like elements included in the surface emitting semiconductor laser 500 of the third embodiment, and the description is omitted.

On the first upper mirror, a p-type GaAs contact layer 801 is formed, whose thickness is adjusted so as to form a distributed Bragg reflector together with the GaAs layer 502. On the contact layer 801, a second SiO₂/TiO upper mirror 802 of a dielectric material is formed so as to cover the top surface of the AlAs layer 503. The upper mirror and the lower mirror 102 together form a laser cavity. Also, a p-type electrode 803 is formed in a portion on the top surface of the contact layer 801 where the second upper mirror 802 is not formed.

In this embodiment, not a semiconductor multilayer film but a dielectric multilayer film is used as the upper mirror as is shown in FIG. 8. In a mirror of a semiconductor multilayer film, the difference in the refractive index between two kinds of semiconductor layers included therein is so small that it is necessary to increase the number of pairs of the semiconductor layers in order to attain a desired high reflectance, and therefore, the resultant mirror has a large thickness of approximately 2 through 4 μm. Such a large thickness can burden the crystal growth requiring strict control of a growth rate and a subsequent process. Accordingly, the fabrication procedures can be complicated and the yield can be decreased.

On the other hand, in adopting the dielectric mirror, since a current cannot be injected through the mirror, the contact layer 801 is formed on the GaAs layer 502 of the first upper mirror 504, and the p-type electrode 803 is formed on the contact layer 801. This means that a current can be injected not through a mirror, which is a main cause to increase the device resistance, and hence, the device resistance can be absolutely decreased.

As described above, in the surface emitting semiconductor laser 800 of this embodiment, the SiO₂/TiO₂ mirror 802 is used as the second upper mirror, and the p-type electrode 803 is formed on the p-type GaAs contact layer 801. As a result, the surface emitting semiconductor laser with a low resistance can be provided. Moreover, since the dielectric mirror can be formed in a smaller thickness and can be fabricated more easily than the semiconductor mirror, the fabrication procedures for the surface emitting semiconductor laser can be simplified, the yield can be improved and the fabrication cost can be decreased.

The selective oxidation region is formed on the active region in each of the third and fourth embodiments, but it can be formed on the substrate below the active region. Moreover, it goes without saying that, in any of the embodiments, the conductivity types are exchangeable between the p-type and the n-type, and that the material is not limited to GaAs but can be any of InP, ZnSe and GaN.

According to the surface emitting semiconductor laser of this invention, a current confining region formed out of an ion implanted layer with a higher resistance is disposed below an active layer, and therefore, the active layer can be prevented from being damaged by the ion implantation during the fabrication. Also, since a distance between the current confining region and the active layer can be decreased, the current can be suppressed from spreading in the lateral direction.

According to another aspect of the surface emitting semiconductor laser of this invention, at least one of a lower mirror and an upper mirror is formed of a semiconductor multilayer film including alternately and repeatedly stacked first and second layers,.and merely the first layer closest to an active region includes a closed area of a semiconductor and an oxide area surrounding the closed area. Accordingly, the resistance of the mirror can be decreased.

According to the method of fabricating a surface emitting semiconductor laser of this invention, two crystal growth are combined with ion implantation or selective oxidation, resulting in realizing a surface emitting semiconductor laser with a low resistance and a low threshold.

Also, since a mesa is formed through selective growth or an alignment pattern is formed on the back surface of the substrate, the fabrication procedures for the surface emitting semiconductor laser can be simplified.

What is claimed is:

1. A surface emitting semiconductor laser comprising an active region including an active layer, and a lower mirror and an upper mirror sandwiching said active region, wherein at least one of said lower mirror and said upper mirror is formed of a semiconductor multilayer film obtained by alternately and repeatedly stacking a first layer and a second layer, merely said first layer closest to said active region includes a closed area made of a semiconductor and an oxide area surrounding said closed area, wherein an aluminum composition of said closed area is the same as an aluminum composition of said first layer in said semiconductor multilayer film, wherein further comprises a further layer formed on a top surface of said first layer closest to said active region, and wherein said further layer has a thickness of approximately 1 nm through approximately 10 nm, and is made of a semiconductor of which said second layer is made.

2. The surface emitting semiconductor laser of claim 1, wherein said lower mirror and said upper mirror are both formed of said semiconductor multilayer film.

3. A The surface emitting semiconductor laser of claim 1, wherein said lower mirror is formed of said semiconductor multilayer film and said upper mirror is formed of a dielectric multilayer film.

4. A surface emitting semiconductor laser comprising an active region including an active layer, and a lower mirror and an upper mirror sandwiching said active region, wherein said upper mirror includes a first upper mirror and a second upper mirror formed on said first upper mirror, said first upper mirror has a first layer close to said active region and a second layer formed on said first layer, merely said first layer of said first upper mirror includes a closed area made of a semiconductor and an oxide area surrounding said closed area, said second layer of said first upper mirror as uppermost layer has a thickness of approximately 1 nm through approximately 10 nm, wherein said second upper mirror is formed of a semiconductor multilayer film obtained by alternately and repeatedly stacking a first layer and a second layer, wherein an aluminum composition of said closed area is the same as an aluminum composition of said first layer in said semiconductor multilayer film.

5. The surface emitting semiconductor laser of claim 4, wherein said second layer of said first upper mirror and said second layer of said second upper mirror are made of same semiconductor, respectively, and said second layer of said second upper mirror as the lowermost layer of said second upper mirror is disposed on said second layer of said first upper mirror.

* * * * *

UNITED STATES PATENT AND TRADEMARK OFFICE
CERTIFICATE OF CORRECTION

PATENT NO. : 6,526,081 B2
DATED : February 25, 2003
INVENTOR(S) : Yasuhiro Kobayashi It is certified that error appears in the above-identified patent and that said Letters Patent is hereby corrected as shown below:

<u>Title page,</u>
Item [56], References Cited, U.S. PATENT DOCUMENTS, please add
-- 5,747,366  12/1996  Brillouet --

<u>Column 13,</u>
Line 21, delete "A" before "The"

Signed and Sealed this

Thirteenth Day of April, 2004

JON W. DUDAS
*Acting Director of the United States Patent and Trademark Office*